United States Patent [19]

Onda et al.

[11] Patent Number: 4,965,313

[45] Date of Patent: Oct. 23, 1990

[54] NOVEL PHOTOCURABLE AND HEAT-CURABLE POLYVINYL BUTYRAL RESIN

[75] Inventors: Yoshiro Onda, Tokyo; Soji Tanioka, Kanagawa, both of Japan

[73] Assignee: Shin-Etsu Chemical Co., Ltd., Tokyo, Japan

[21] Appl. No.: 363,619

[22] Filed: Jun. 7, 1989

[30] Foreign Application Priority Data

Jun. 24, 1988 [JP] Japan .................................. 63-156314

[51] Int. Cl.$^5$ ................................................ C08F 8/00
[52] U.S. Cl. ........................................ 525/59; 525/60; 525/61
[58] Field of Search ............................. 525/59, 60, 61

[56] References Cited

U.S. PATENT DOCUMENTS 3,647,756  3/1972  Okaya et al. ........................... 525/59

*Primary Examiner*—Joseph L. Schofer
*Assistant Examiner*—J. M. Reddick
*Attorney, Agent, or Firm*—Wyatt, Gerber, Burke & Badie

[57] ABSTRACT

The invention discloses a novel modified polyvinyl butyral polymer having photocurability and heat-curability containing an ethylenically unsaturated moiety, which is introduced by the reaction of, for example, N-methylol acrylamide with a part of the hydroxyl groups, in addition to the vinyl butyral moiety, vinyl acetate moiety and vinyl alcohol moiety constituting conventional polyvinyl butyral resins. The inventive polymer is useful for various types of adhesives, coating materials, interlayers of laminated shatter-proof glass and the like similarly to unmodified polyvinyl butyral resins but with a possibility of broadened utilizability and absence of the problems due to evaporation of organic solvents.

2 Claims, No Drawings

NOVEL PHOTOCURABLE AND HEAT-CURABLE POLYVINYL BUTYRAL RESIN

BACKGROUND OF THE INVENTION

Polyvinyl butyral resins belong to a class of well known synthetic plastic materials and are widely used in modern industries owing to their outstandingly unique characteristics including the possibility of their utilization both as a thermoplastic and as a thermosetting resin, solubility in various organic solvents, adhesiveness to metals, plastics and glassy materials and high mechanical strengths such as impact resistance, tensile strength and the like. Therefore, polyvinyl butyral resins are conventionally used, for example, as an adhesive for printed circuit boards, binder for ceramic materials and coating material as well as an interlayer for laminated shatter-prrof glass in the form of a film and so on.

Despite the versatile utilizability of polyvinyl butyral resins as mentioned above, however, there are some difficulties in the application thereof. For example, use of an organic solvent in various preparations mentioned above is accompanied by (1) a serious problem relative to the health administration in the working environment and complicated process due to the requirement for completely removing the organic solvent from the products by evaporation after application, (2) decrease in the solvent resistance of the shaped articles and (3) troubles due to the extremely high viscosity of a high-solid solution.

Furthermore, some problems still remain in the use of a polyvinyl butyral resin as an interlayer of laminated shatter-proof glass because films of the polyvinyl butyral resin must be shaped in advance followed by a sandwiching process of the film between two glass plates so that high-quality products can be prepared only with a complete quality control necessarily leading to an increase in the manufacturing costs. In addition, such a laminated glass is not always satisfactory in respect of the heat resistance.

SUMMARY OF THE INVENTION

In view of the above mentioned problems in the art using polyvinyl butyral resins in industry, the inventors have conducted extensive investigations leading to completion of the invention which provides a novel and improved polyvinyl butyral resin as a modification of conventional polyvinyl butyral resins. The modified polyvinyl butyral resin of the invention is a polymer consisting of a moiety of N-methylolacrylamide vinyl ether groups in addition to the moieties in conventional polyvinyl butyral resins. By virtue of this characteristic moiety comprised in the polymeric structure, the inventive polyvinyl butyral resin is imparted with both photocurability and heat-curability.

Thus, the modified polyvinyl butyral resin of the invention is a novel polymer not known in the prior art and represented by the formula.

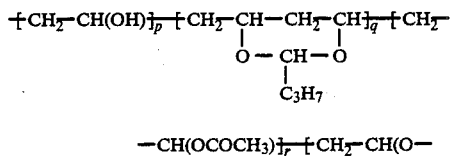

in which p,q,r and z are each a positive integer. In particular, the modified polyvinyl butyral resin of the invention is useful when the subscripts p,q,r and z in the above given general formula satisfy the relationship that p/(p+q+r+z) is in the range from 0.01 to 0.44, q/(p+q+r+z) is in the range from 0.55 to 0.72, r/(p+q+r+z) does not exceed 0.08 and z/(p+q+r+z) is in the range from 0.01 to 0.44.

DETAILED DESCRIPTION OF THE PREFERRED EMBODIMENTS

As is described above, the novel polyvinyl butyral polymer of the invention consists in four types of the monomeric moieties including the vinyl alcohol moiety of the formula [—$CH_2$—CH(OH)—], vinyl butyral moiety of the formula

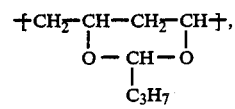

vinyl acetate moiety of the formula [—$CH_2$—CH-(O—CO—$CH_3$)—] and ethylenically unsaturated N-methylolacrylamide vinyl ether moiety of the formula [—$CH_2$—CH(O—$CH_2$—NH—CO—CH=$CH_2$)—]. It is preferable that the relative fractions of these four types of the moieties in the polymer are given by the relationship of the subscripts p, q, r and z in the formula mentioned above. The former three types of the momomeric moieties are conventional in polyvinyl butyral resins of the prior art while the fourth moiety is characteristic in the inventive polymer.

When either one or more of the vinyl alcohol, vinyl butyral and vinyl acetate moieties are contained in the polymer in fractions outside the above mentioned ranges, the polymer no longer exhibits the properties characteristic of a polyvinyl butyral resin. When the relative fraction of the unsaturated moiety is smaller than 0.01, the polymer cannot be imparted with sufficiently high photocurability and heat-curability. When the fraction thereof exceeds 0.44, the polymer would lose the characteristic properties as a polyvinyl butyral resin in addition to the increase in the production costs with no further additional advantageous effects on the quality.

The novel polyvinyl butyral resin of the invention can be prepared by a method described below. Thus, a conventional product of a polyvinyl butyral resin is usually used as the starting material to be reacted with N-methylol acrylamide to introduce the ethylenically unsaturated moiety. It is noted that conventional polyvinyl butyral products contain from 30 to 40% by moles of the polyvinyl alcohol moiety to react with N-methylol acrylamide. N-methylol acrylamide is a compound having reactivity with hydroxy groups in several polymers. For example, U.S. Pat. Nos. 4,490,516 and 4,557,951 disclose a cellulose ester derivative obtained by the condensation reaction of N-methylol acrylamide with a cellulose ester such as cellulose acetate butyrate to replace the hydrogen atoms in the hydroxy groups of the polymer with the groups of the formula —$CH_2$NH—CO—CH=$CH_2$.

In practicing the reaction between a polyvinyl butyral and N-methylol acrylamide as the starting materials, these components are dissolved or dispersed in a reaction medium such as water or an organic solvent selected from alcohols, ketones and the like as well as mixtures thereof together with an acid catalyst, polymerization inhibitor and the like. The reaction mixture is kept at an appropriately increased reaction temperature sufficient to effect the reaction for a time sufficiently long to give a desired degree of the reaction between the reactants with stirring or kneading. The modified polyvinyl butyral thus obtained is processed into a final product after a suitable post-treatment as will be described later.

The polyvinyl butyral resin used in this method can further contain a small amount of other types of acetal groups including aromatic acetal groups such as benzal groups and aliphatic acetal groups other than butyral such as formal, propional, valeral, capral and caprilal groups partly substituting for the butyral groups. The vinyl alcohol moiety in the polyvinyl butyral resin can be partly replaced with other types of monomeric moieties introduced by the copolymerization of various comonomers such as olefins, e.g., ethylene, propylene, butylene and the like, unsaturated carboxylic acids, e.g., acrylic acid and the like, as well as alkyl salts thereof, acrylamide, N,N-dimethyl acrylamide, alkyl vinyl ethers and sulfonic acid-containing monomers, e.g., 2-acrylamide-2-methylpropane sulfonic acid and the like as well as alkali salts thereof.

The acid catalyst is selected from phosphoric acid, hydrochloric acid, p-toluene sulfonic acid, ammonium chloride, citric acid, tartaric acid and the like. The polymerization inhibitor is selected from hydroquinone, hydroquinone methyl ether, p-benzoquinone and the like. Selection of these components should be made taking the solubility thereof in the used solvent into consideration.

Alternatively, the modified polyvinyl butyral of the invention can be prepared by a method described below. Thus, the modified polyvinyl butyral is prepared by, for example, a method in which both the acetalization reaction with butyraldehyde and the condensation reation of N-methylol acrylamide with the polyvinyl alcohol moiety are concurrently effected by adding these modifying reactants simultaneously to the reaction mixture instead of using a preformed polyvinyl butyral, a method in which the vinyl alcohol moiety is partly reacted with N-methylol acrylamide followed by the acetalization reaction of the rest of the vinyl alcohol moiety with butyl alcohol and so on.

The modified polyvinyl butyral thus obtained can be converted into a purified product according to need by undertaking a post-treatment including the steps of drying by the evaporation of the solvent and other volatile matters from the reaction mixture, washing of the thus obtained crude product with a suitable solvent and drying. It is optional that a reaction mixture containing the starting polyvinyl butyral resin, N-methylol acrylamide, acid catalyst, polymerization inhibitor and the like dissolved in an organic solvent is subjected to a heating and drying treatment such as vacuum drying, oven drying, drum drying, spray drying and the like to effect the reaction of the reactants and drying in one step. When the modified resin product is dissolved in the organic solvent as the reaction medium to form a uniform reaction mixture, the resin product can be precipitated in the reaction mixture by adding another solvent which is freely miscible with the slolvent as the reaction medium but is a poor solvent for the resin and then recovered by filtration or centrifugal separation followed by the purification treatment as described above. It is of course that a resin product which is not dissolved in the reaction mixture can be directly recovered without adding any precipitant solvent.

The modified polyvinyl butyral according to the invention has a chemical structure which is basically the same as that of the conventional polyvinyl butyral as the starting material as is readily understood from the above given general formula except that the hydrogen atoms of the hydroxyl groups in the vinyl alcohol units are partly replaced with the ethylenically unsaturated groups derived from N-methylol acrylamide which impart photocurability and heat curability to the polymer having the basically the same polymeric structure and consequently the same properties as conventional polyvinyl butyral resins. Namely, the modified polyvinyl butyral resin of the invention is curable by the irradiation with actinic rays such as ultraviolet light, electron beams and the like or by heating in the presence of a photosensitizer or polymerization initiator.

By virtue of the above described features, the inventive product is advantageous in various applications including improvements of adhesives, coating compositions and the like, to which conventional polyvinyl butyral resins can also be applied, in respect of the solvent resistance, adhesiveness, heat resistance, mechanical strength and the like after irradiation with light or heat treatment of the coating layer with the aid of a polymerization initiator, improvements in the adhesiveness, heat resistance, mechanical strength and the like of an interlayer film of laminated shatter-proof glass by the irradiation with light following sheeting of the resin into a film and improvements in the adhesiveness and tensile strength of a conventional photocurable resin composition containing a photocurable monomer or oligomer by the admixture of the inventive resin. Accordingly, the modified polyvinyl butyral of the invention is hopefully a useful material in various applications in the recently developing industrial fields as a sealant of particle boards, top-coating or hard coatings on various plastic-made articles, sheathing or cladding material on optical fibers, adhesive for various types of optical lenses, sealing or encapsulating agent for liquid crystal display units, temporary fitting agent of semiconductor chips on printed circuit boards and the like. In addition, the inventive resin is a promising substitute for conventional photocurable resins in the formulations of photocurable coating compositions, inks and adhesives. A mixture of the inventive polymer and a photopolymerizable monomer capable of dissolving the former can be used by irradiation with light without the problems accompanying the use of an organic solvent responsible for environmental pollution by evaporation. In the manufacture of laminated shatter-proof glass having an interlayer, the production line can be greatly simplified by using a liquid composition containing the inventive polymer, photopolymerizable monomer and photopolymerization initiator which fills the space between two glass plates and is irradiated with light to give a cured polymeric interlayer instead of using a preformed interlayer film of a polyvinyl butyral resin.

The polymerization initiator jointly used with the inventive polymer in the various fields of applications as above is selected from those conventionally used in compositions containing a photocurable resin such as benzoyl peroxide, benzil, biacetyl, azobisisobutyronitrile and the like. The photopolymerizable ingredient used in the photocurable resin composition include photopolymerizable monomers such as 2-ethylhexyl acrylate, 1,6-hexanediol diacrylate, trimethylolpropane triacrylate and the like and photopolymerizable oligomers such as polyester acrylates, epoxy acrylates, polyurethane acrylates, polyether acrylates and the like.

The invention is described below in more detail by way of examples which, however, should not be construed in any way to restrict the scope of the invention.

EXAMPLE 1

Into a reaction vessel equipped with a stirrer was introduced one liter of ethyl acetate to which 0.2 g of hydroquinone, 0.4 g of 85% phosphoric acid and 100 g of N-methylol acrylamide were added and dissolved with stirring to give a uniform solution. Then, 62 g of a polyvinyl butyral resin (Esrec B BL-2, a product by Sekisui Chemical Co.) containing 63% by moles of the butyral moiety and 35% by moles of the vinyl alcohol moiety were added to the above prepared solution and reacted at 50° C. for 6 hours. The reaction mixture after cooling was filtered and the thus obtained crude product was washed with a mixture of water and ethyl alcohol followed by drying to give 67 g of a purified product. The results of the analysis for the molar fractions of the respective types of the monomeric moieties were: 2% by moles of the acetyl-containing moiety; 63% by moles of the butyral-containing moiety; 22% by moles of the unsaturated group-containing moiety; and 13% by moles of the hydroxy-containing moiety.

EXAMPLE 2

Into a reaction vessel equipped with a stirrer was introduced one liter of acetone and then 62 g of a polyvinyl butyral resin (Esrec B BL-1, a product by Sekisui Chemical Co.) containing 63% by moles of the butyral moiety and 35% by moles of the vinyl alcohol moiety were added thereto and dissolved with stirring to give a uniform solution. Thereafter, 1 g of hydroquinone methyl ether, 0.5 g of 85% phosphoric acid and 100 g of N-methylol acrylamide were added to the solution and reacted at 50° C. for 4 hours. After cooling, the reaction mixture was diluted by adding 0.5 liter of acetone and then water was added thereto in small portions with stirring to precipitate a crude poroduct which was purified by washing successively with water and a mixture of water and ethyl alcohol to give 66 g of a purified product. The results of the analysis for the molar fractions of the respective types of the monomeric moieties were: 1.5% by moles of the acetyl-containing moiety; 64% by moles of the butyral-containing moiety; 25% by moles of the unsaturated group-containing moiety; and 9.5% by moles of the hydroxy-containing moiety.

EXAMPLE 3

An aqueous solution was prepared by dissolving 2.0 g of 85% phosphoric acid, 6 g of hydroquinone methyl ether and 300 of N-methylol acrylamide in one liter of purified water contained in a beaker. The aqueous solution under agitation was admixed with 1000 g of a polyvinyl butyral resin (Esrec BM-5, a product by Sekisui Chemical Co.) containing 65% by moles of the butyral moiety and 33% by moles of the vinyl alcohol moiety to give a slurry. The slurry thus prepared was subjected to filtration until 800 g of the filtrate was discharged out of the filter. An aluminum-made box was evenly filled with the residual filter cake which was heated at 50° C. for 10 hours in a drying oven. The thus obtained crude product was cooled and washed successively with water and a mixture of water and ethyl alcohol followed by drying to give 995 g of a purified product. The results of the analysis for the molar fractions of the respective types of the monomeric moieties were: 5% by moles of the acetyl-containing moiety; 71% by moles of the butyral-containing moiety; 10% by moles of the unsaturated group-containing moiety; and 14% by moles of the hydroxy-containing moiety.

EXAMPLE 4

Solutions were prepared each by dissolving 10 g of one of the modified polyvinyl butyral polymers obtained in Examples 1 to 3 and 0.3 g of benzil in 10 g of acetone. Semidried films of the respective polymers having a thickness of 50 μm were prepared by casting the solution on a glass plate and evaporating the solvent at room temperature until about a half amount thereof had been evaporated. The film was irradiated with ultraviolet light at a running speed of 5 meters/minute 10 times repeatedly 4 cm below a high-pressure mercury lamp of 80 watts/cm power input. The thus UV-irradiated film weighing 5 g was immersed in 300 g of acetone at room temperature for 1 hour and the % insolubilization of the film was determined by weighing the undissolved film to give the results of 85%, 91% and 80% for the films prepared from the modified polymers obtained in Examples 1, 2 and 3, respectively.

EXAMPLE 5

Films of the modified polyvinyl butyral polymers obtained in Examples 1, 2 and 3 having a thickness of 100 μm were prepared each by casting a solution of 10 g of the polymer and 0.3 g of benzoyl peroxide in 20 g of a 7:3 mixture of benzene and acetone on a glass plate followed by drying at 100° C. for 5 hours. The films were subjected to the determination of the insolubilized fraction in the same manner as in Example 4 to give the results of 90%, 95% and 86% for the films prepared from the modified polymers obtained in Examples 1, 2 and 3, respectively.

What is claimed is:

1. A modified polyvinyl butyral polymer having photocuarability and heat-curability containing an ethylenically unsaturated moiety which is represented by the general formula

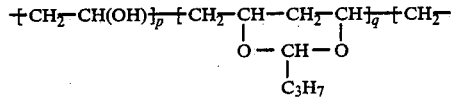

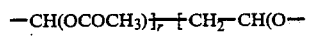

in which p, q, r and z are each a positive integer.

2. The modified polyvinyl butyral polymer as claimed in claim 1 in which p, q, r and z are each a positive integer with the proviso that $p/(p+q+r+z)$ is in the range from 0.01 to 0.44, $q/(p+q+r+z)$ is in the range from 0.55 to 0.72, $r/(p+q+r+z)$ does not exceed 0.08 and $z/(p+q+r+z)$ is in the range from 0.01 to 0.44.

* * * * *